United States Patent
Yue et al.

(10) Patent No.: US 6,180,441 B1
(45) Date of Patent: Jan. 30, 2001

(54) BAR FIELD EFFECT TRANSISTOR

(75) Inventors: John T. Yue, Los Altos; Matthew S. Buynoski, Palo Alto; Yowjuang W. Liu; Peng Fang, both of San Jose, all of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/307,698

(22) Filed: May 10, 1999

Related U.S. Application Data

(62) Division of application No. 08/766,494, filed on Dec. 13, 1996, now Pat. No. 5,932,911.

(51) Int. Cl.[7] ..................... H01L 21/336; H01L 21/8234; H01L 21/22
(52) U.S. Cl. .................. 438/197; 438/259; 438/270; 438/271; 438/589
(58) Field of Search ................ 438/197, 259, 438/270, 271, 589

(56) References Cited

U.S. PATENT DOCUMENTS

| | | | |
|---|---|---|---|
| 4,835,584 | * | 5/1989 | Lancaster ................. 357/23.1 |
| 5,134,448 | * | 7/1992 | Johnsen et al. ............ 357/23.4 |
| 5,155,562 | * | 10/1992 | Tsuchiya ................. 357/23.4 |
| 5,177,572 | * | 1/1993 | Murakami ................ 257/260 |
| 5,262,336 | * | 11/1993 | Pike et al. ................ 437/31 |
| 5,283,201 | * | 2/1994 | Tsang et al. .............. 437/31 |
| 5,432,107 | * | 7/1995 | Uno et al. ................ 437/35 |
| 5,648,283 | * | 7/1997 | Tsang et al. .............. 437/40 |
| 5,721,443 | * | 2/1998 | Wu ....................... 257/344 |

* cited by examiner

Primary Examiner—Donald L. Monin, Jr.
Assistant Examiner—S. H. Rao
(74) Attorney, Agent, or Firm—Foley & Lardner

(57) ABSTRACT

A field effect transistor is formed across a one or more trenches (26) or bars (120), thereby increasing the effective width of the channel region and the current-carrying capacity of the device.

16 Claims, 7 Drawing Sheets

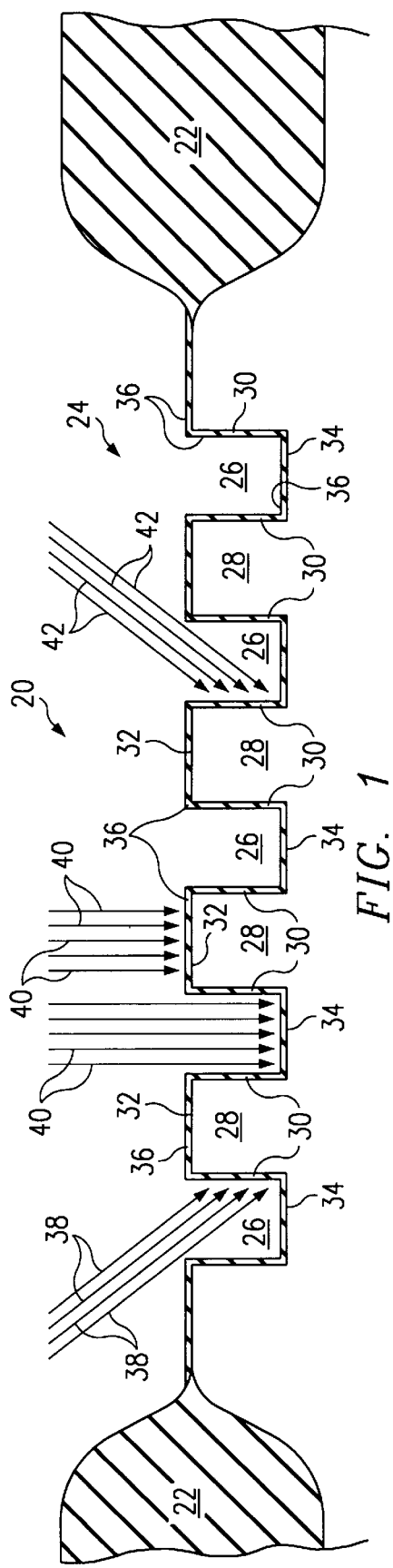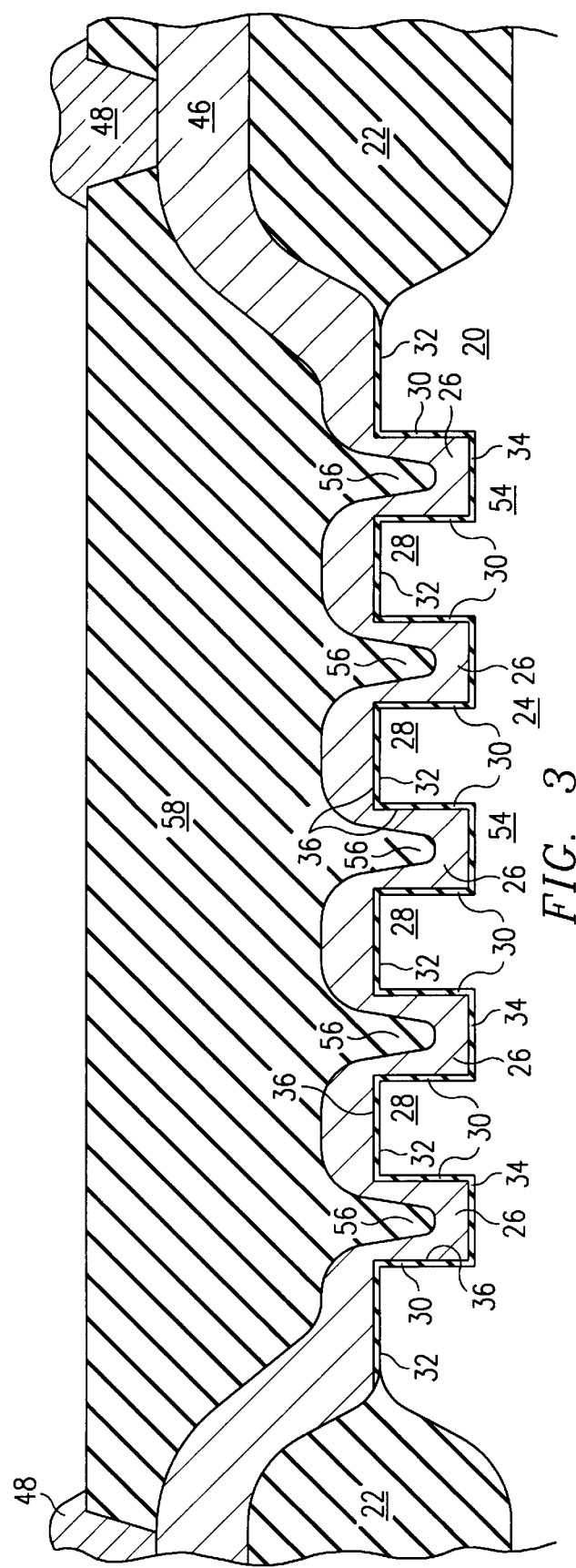

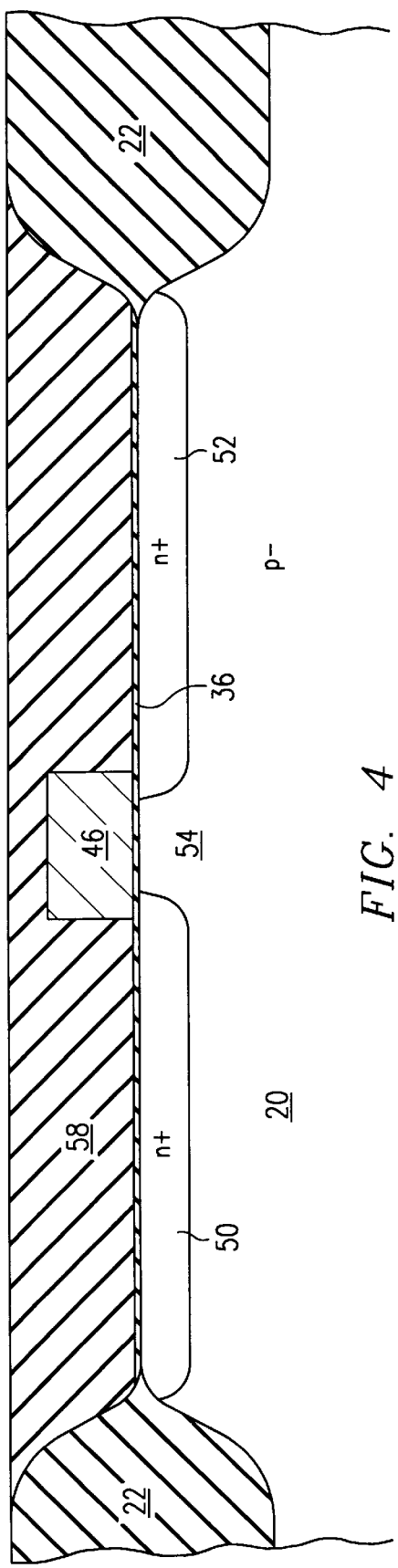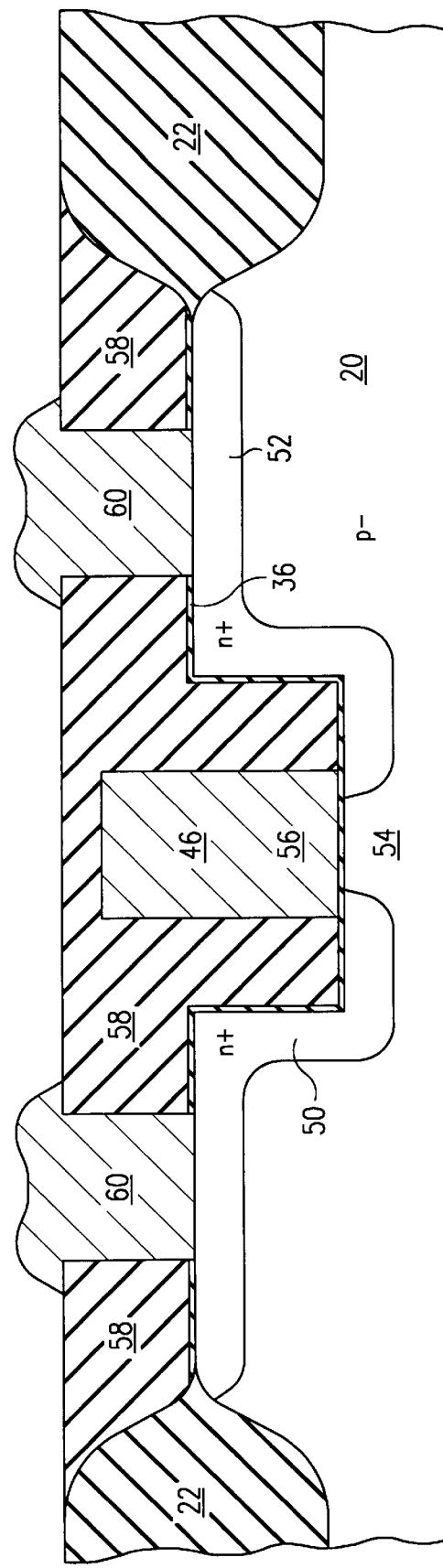

BAR FIELD EFFECT TRANSISTOR

CROSS REFERENCE TO RELATED APPLICATIONS

The present application is a division of and claims priority to U.S. patent application Ser. No. 08/766,494 filed Dec. 13, 1996, now U.S. Pat. No. 5,932,911.

TECHNICAL FIELD OF THE INVENTION

The present invention relates in general to three-dimensional transistors and transistors having complex topography, and more particularly to field effect transistors using trenches and bars to enhance effective width.

BACKGROUND OF THE INVENTION

In conventional planar integrated circuit fabrication technology, in order to increase the current capacity of a field effect transistor, one must expand the width of the channel region in a direction parallel to the gate to get increased parallel current flow between the source and the drain of the device. Enhancement of the current capacity of a transistor has therefore usually meant increased occupation of semiconductor chip "real estate." A need continues to exist for transistors exhibiting enhanced current carrying capacity but which do not have enhanced expense in terms of the semiconductor chip area that they occupy.

SUMMARY OF THE INVENTION

The present invention provides a solution to this technical problem by making the channel region and the insulated gate controlling the conductance of the channel region nonplanar. According to a first aspect of the invention, a field effect transistor is formed at the face of a semiconductor layer which has at least two depressions formed in its surface, preferably elongated in a first direction, the depressions being laterally spaced apart in a second direction by an eminence, ridge or bar with a top surface. Sidewalls of the eminence extend from the top surface thereof to the bottoms of the depressions. A conductive gate is formed on portions of the top and the sidewalls of the eminence to be insulatively spaced therefrom and to extend in the second direction. A source of the field effect transistor is formed on one side of the gate to include a portion of the eminence, and a drain is formed on the other side of the insulated gate to include another portion of the eminence. A channel region of the semiconductor layer formed underneath the gate spaces the source from the drain.

In one embodiment, the semiconductor layer has a plurality of trenches formed in its surface which are elongated in the first direction and which extend in a linear array in the second direction. An insulated gate is formed to intersect each of the trenches and the ridges defined between the trenches. A source and a drain are implanted into the semiconductor layer as self-aligned to the insulated gate, such that both the source and the drain occupy respective portions of the trenches and the ridges of semiconductor layer in between. The channel region in between the source and the drain has a series of valleys or trenches and mesas or ridges in between the trenches, with each portion of the channel region being proximate to a portion of the insulated gate.

According to another embodiment of the invention, portions of a semiconductor layer inside of an active device region are removed to leave a plurality of spaced-apart bars that are elongated in the first direction and are spaced from each other in a second direction at an angle to the first direction. An insulated gate is formed across each of the bars and the valleys in between the bars to extend in the first direction. As before, a source and drain implant can be self-aligned to this insulated gate. After filling the topography with an insulating layer such as oxide, contacts may advantageously be made to the source and drain of the transistor at the end of each bar, such that contact will be made both through a bottom and a sidewall of the contact hole.

The present invention confers a technical advantage in that by either forming trenches in the semiconductor surface or by forming elevated bars thereon, the resultant channel region has an increased surface area for the close adjacency of the insulated gate. Instead of just have a relatively planar surface for the insulated gate to pass across, there are a series of sidewalls of semiconductor material connecting ridges and valleys thereof, and the insulated gate is formed adjacent to these sidewalls also. This increases the effective width of the channel region between the source and the drain and therefore the current carrying capacity of the device. Devices may be built having an effective width that is substantially greater than the actual width.

BRIEF DESCRIPTION OF THE DRAWINGS

Other aspects of the invention and their technical advantages will be discerned with reference to the following detailed description when taken in conjunction with the drawings, in which like characters number like parts and in which:

FIG. 1 is a schematic, highly magnified cross-sectional view of a transistor according to the invention in a preliminary stage of fabrication;

FIG. 3 is a sectional view taken substantially along line 3—3 of FIG. 2 and also corresponding to the sectional view shown in FIG. 1;

FIG. 4 is a schematic cross-sectional view taken substantially along line 4—4 of FIG. 2;

FIG. 5 is a schematic cross-sectional view taken substantially along line 5—5 of FIG. 2;

DETAILED DESCRIPTION OF ILLUSTRATED EMBODIMENT

Figure 2:
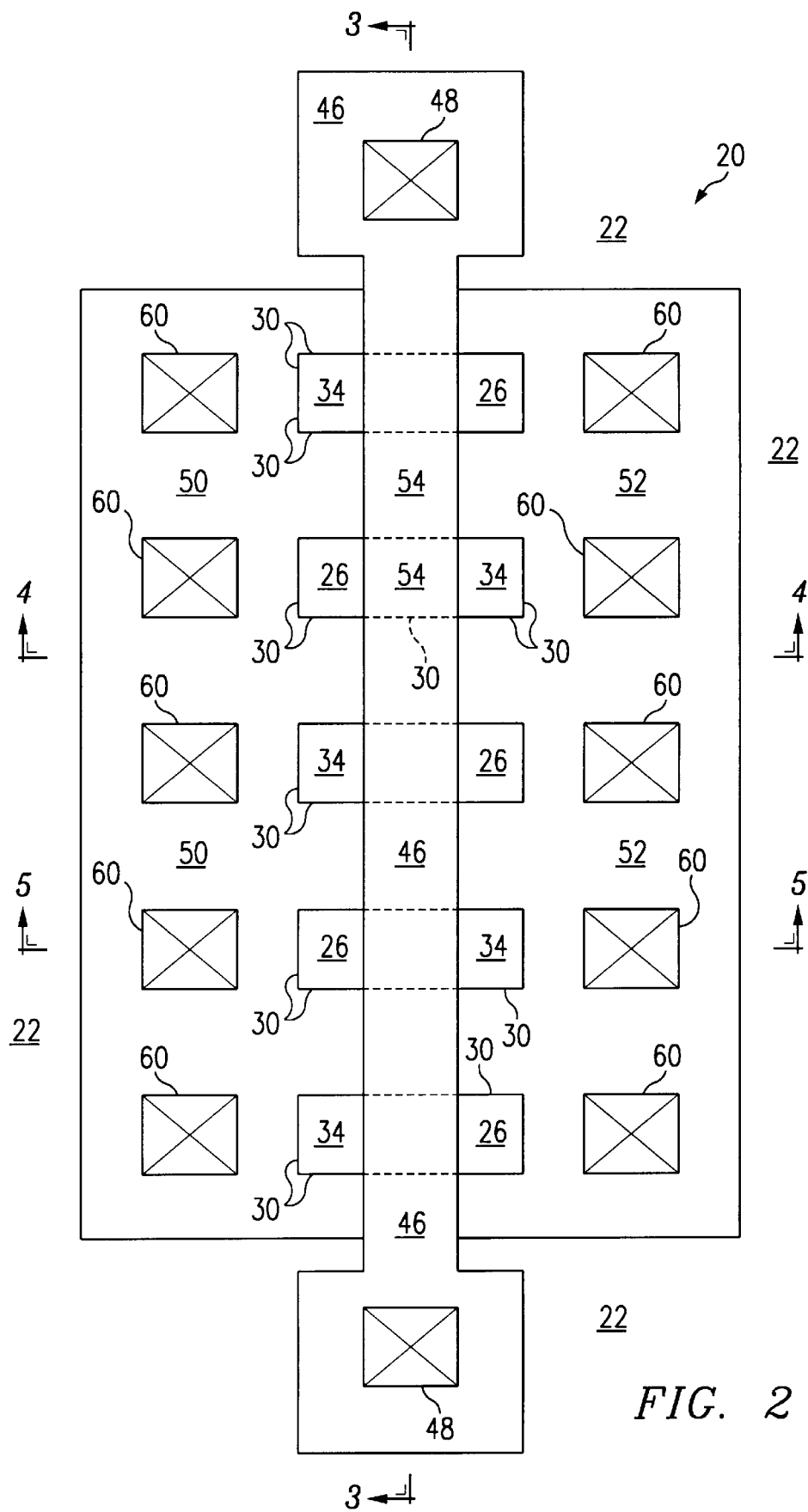
FIG. 2 is a highly magnified schematic plan view of this transistor as completed.

Referring first to FIG. 1, beginning stages of fabrication of a first embodiment of the invention are illustrated. The device is formed at a face of a semiconductor layer indicated generally at 20, which may for example be an epitaxial layer grown on a semiconductor substrate, or a semiconductor layer grown on an insulative layer such as oxide or sapphire. Silicon is the most common semiconductor material, although other semiconductors such as gallium arsenide and the like may be employed instead. The semiconductor layer 20 is lightly doped to be of a particular conductivity type; where an n-channel field effect transistor is to be formed, this conductivity type will be (p). Of course, both n-channel and p-channel devices may be fabricated according to the invention, and indeed may be fabricated in different areas of the same semiconductor wafer.

In a preparatory stage, a localized oxidation of silicon (LOCOS) process is performed to grow thick oxide regions 22 which laterally isolate and define an active device area indicated generally at 24. Other active area isolation techniques, such as the deep implantation of (p+) channel stops (not shown) beneath the LOCOS oxide regions 22, and shallow trench isolation, may also be employed.

The active device area 24 is then patterned with photoresist or a hard mask and anisotropically etched in order to produce a series of trenches 26 that define a plurality of bars, ridges or eminences 28 formed therebetween. The number of trenches 26 and ridges 28 is arbitrary, and will be determined by the desired current-carrying capacity of the transistor to be fabricated. Each of the trenches 26 and the ridges 28 has a minimum lateral dimension equivalent to one photolithographic feature, which at the time of writing is 0.2 to 0.5 microns. The trenches 26 may be several times deeper than this, but as one proceeds deeper the device becomes more and more difficult to make. In one embodiment, the depth of the trenches 26 is also about one photolithographic feature, or 0.2 to 0.5 microns. As can be seen, the resultant structure has a high-relief topography in which sidewalls 30 connect top surface 32 of the ridges 28 with bottom surfaces 34 of the trenches 26. The effective width w of the transistor thus being fabricated (excluding the two end segments) is equal to the sum of each of the sidewalls 30, bottom surfaces 34 and top surfaces 32; without the formation of these trenches, the effective transistor width would only be the same as the sum of the bottom surfaces 34 and the top surfaces 32.

Next, a gate insulator 36 is formed on all exposed surfaces of the semiconductor layer 20, including all of the sidewalls 26, top surfaces 32 and bottom surfaces 34. The gate insulator may be oxide, nitrous oxide or an oxide-nitride-oxide (ONO) sandwich.

After growing the gate insulator 26, a series of implantations is performed which affect characteristics of the prospective channel region. It is preferred to perform both $V_t$ adjust and punch-through implants at this time. The implants should be done at a plurality of angles, some of which are nonparallel to trench sidewalls 30, in order to assure proper doping of all portions of the semiconductor channel region and particularly those semiconductor portions adjacent the sidewalls. The various implantation angles are represented schematically in FIG. 1 by arrows 38, 40 and 42. For example, a first implantation may be performed at an angle of 30° or 45° from normal, as indicated by arrows 38; a second implant may be performed which is normal to the general surface of the semiconductor layer 20; and a third implant may be performed at 30° or 45° to the layer 20 in the opposite direction. Alternatively, the angle of implant may be continuously varied by, for example, rotation of the semiconductor workpiece, to assure implantation of the appropriate dopant species under the trench bottoms 34, adjacent to the sidewalls 30, and adjacent to the bar or ridge tops 32. An alternative ion implantation method could be by plasma immersed ion implant which is independent of implant angles.

Referring next to FIGS. 2 and 3, a layer of polycrystalline silicon (poly) is deposited upon the surface of the workpiece, patterned and etched to create an elongated, continuous gate 46. The poly constituting the gate 46 may either be doped in situ to be rendered highly conductive, or alternatively the dopant may be present in the material deposited. The gate 46 runs in a direction which is at an angle to the trenches and to the orientation of the future sources and drains, and preferably is perpendicular thereto. The amount of poly which is deposited is preferably such that the material occupying each of the trenches 26 is conductively interconnected, i.e., the gate 46 is continuous. In order to be connected to other components, it is preferred that one or both ends of the poly gate 46 be so formed as to extend up onto the LOCOS isolating oxide regions 22 for the placement of one or more contacts 48 to the gate 46. The width of the gate 46 is intentionally less than the length of the trenches 26, such that a subsequent source/drain implant step (described below) can reach exposed portions of the bottoms 34 and the sidewalls 30 of the trenches 26, expanding the cross-section of source and drain that are adjacent the channel region 54 subsequently formed.

The gate 46 can exist as a relatively conformal layer as shown, or alternatively can be deposited such that its top surface thereof presents a relatively planar surface; in the latter instance (not shown) the amount of poly 46 which is deposited would be increased.

Referring to FIGS. 2, 4 and 5 together, the gate 46 and the LOCOS oxide region 22 may be used to self-align a source/drain implantation into the layer 20 to create a continuous source region 50 and a continuous drain region 52. Source region 50 and drain region 52 are highly doped to be (n+) per usual practice. The implantation of the source and drain regions 50 and 52 should be carried out at various angles in a manner similar to the $V_t$ adjust and punch-through implants, to assure adequate dopant populations near those portions of the trench sidewalls 30 left unconcealed by the poly gate 46. Subsequent annealing and diffusion drive-in steps will expand the source and drain regions slightly underneath the gate 46 as shown (FIG. 4), and will define a channel region 54 underneath the gate 46 which is continuous in the direction of the gate's length and which spaces drain region 52 from source region 50.

Referring back momentarily to FIG. 3, it will be noted that each of the downward extending fingers 56 of the gate 46 permit the close adjacency of the gate 46 to three sides of each bar or ridge 28. Thus, a voltage impressed on the gate 46 will be able to affect the conduction of electrons through the channel region 54 adjacent each bottom surface 34, sidewall 30 and top surface 32. This effectively increases the volume of the channel region 54 and permits greater current-carrying capacity for any given physical width of the channel region 54.

After implantation of the source region 50 and the drain region 52, the active device area 24 may be back-filled with oxide or like insulator in order to present a planarized surface for further processing. This oxide is shown for example at 58 in FIG. 4. A plurality of contact holes 60 are patterned and etched into the intervening oxide 58 to contact to the source region 50 and the drain region 52, as is shown in FIGS. 2 and 5.

Figure 6:
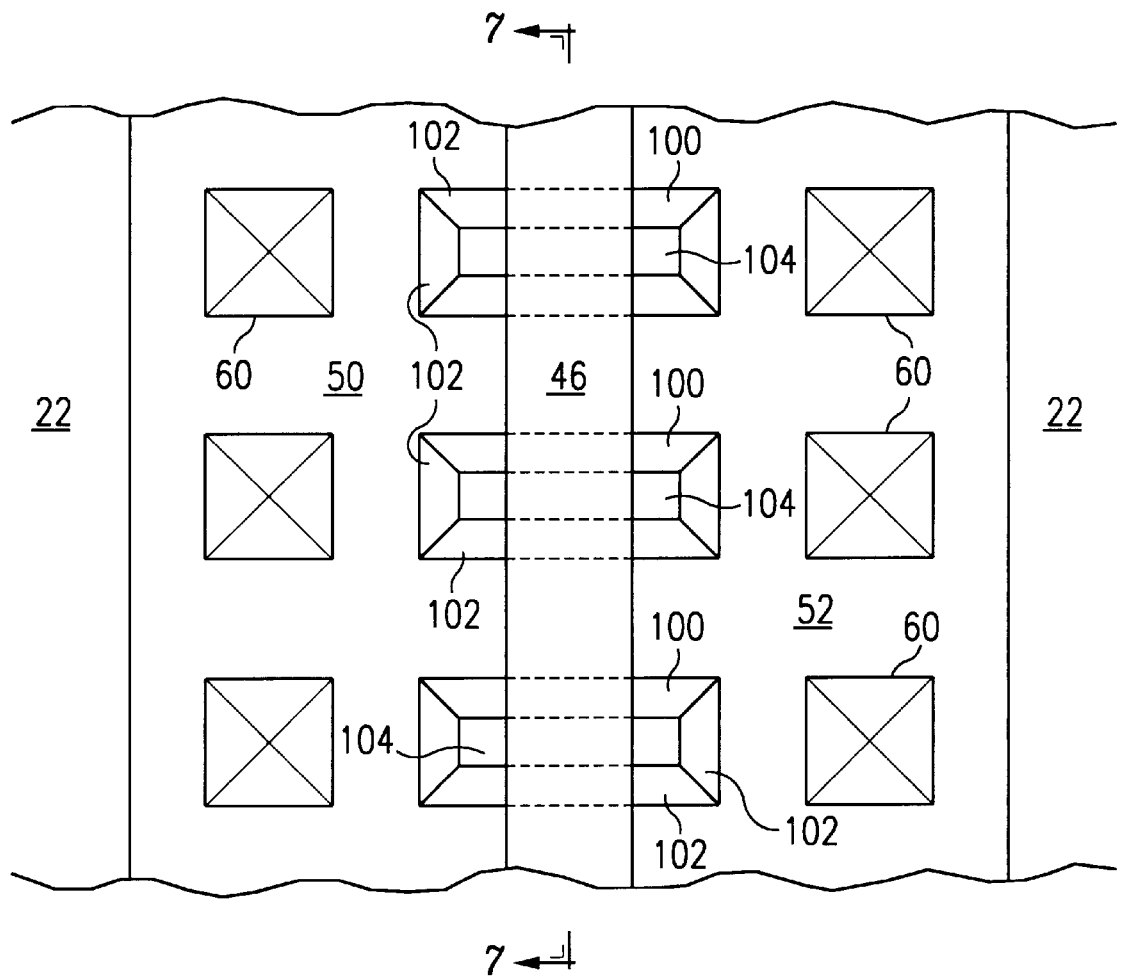
FIG. 6 is a schematic, highly magnified plan view of a second embodiment of the invention.
Figure 7:
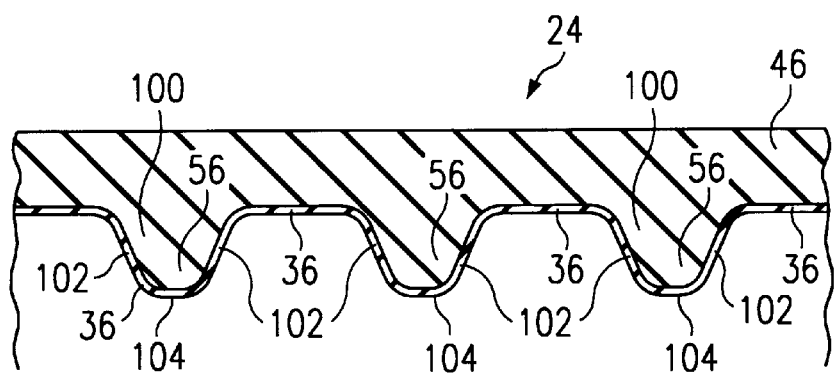
FIG. 7 is a schematic sectional view taken substantially along line 7—7 of FIG. 6.
Figure 8:
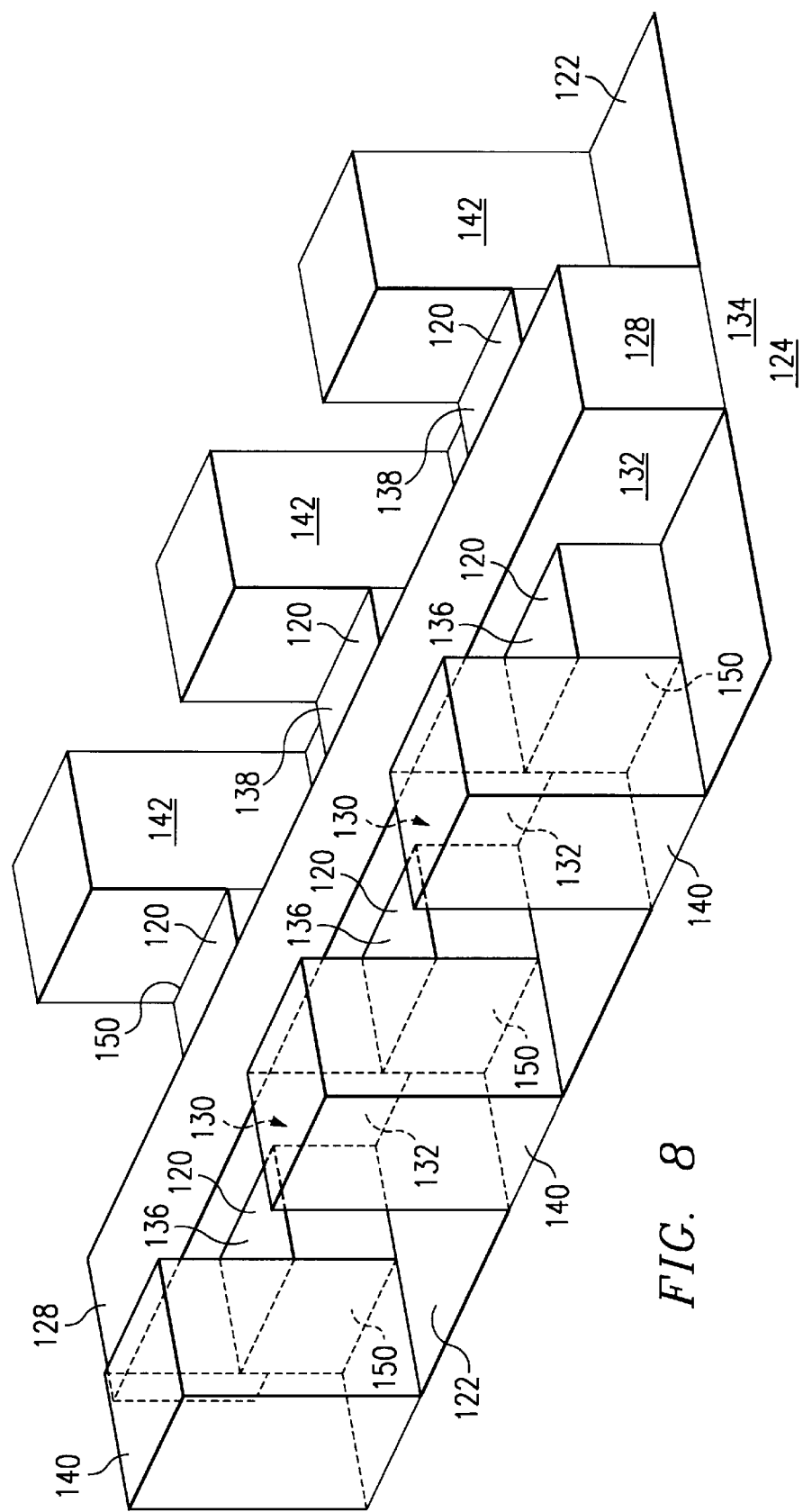
FIG. 8 is a highly magnified schematic isometric view of a third embodiment of the invention, certain structures being shown in phantom to reveal detail.
Figure 9:
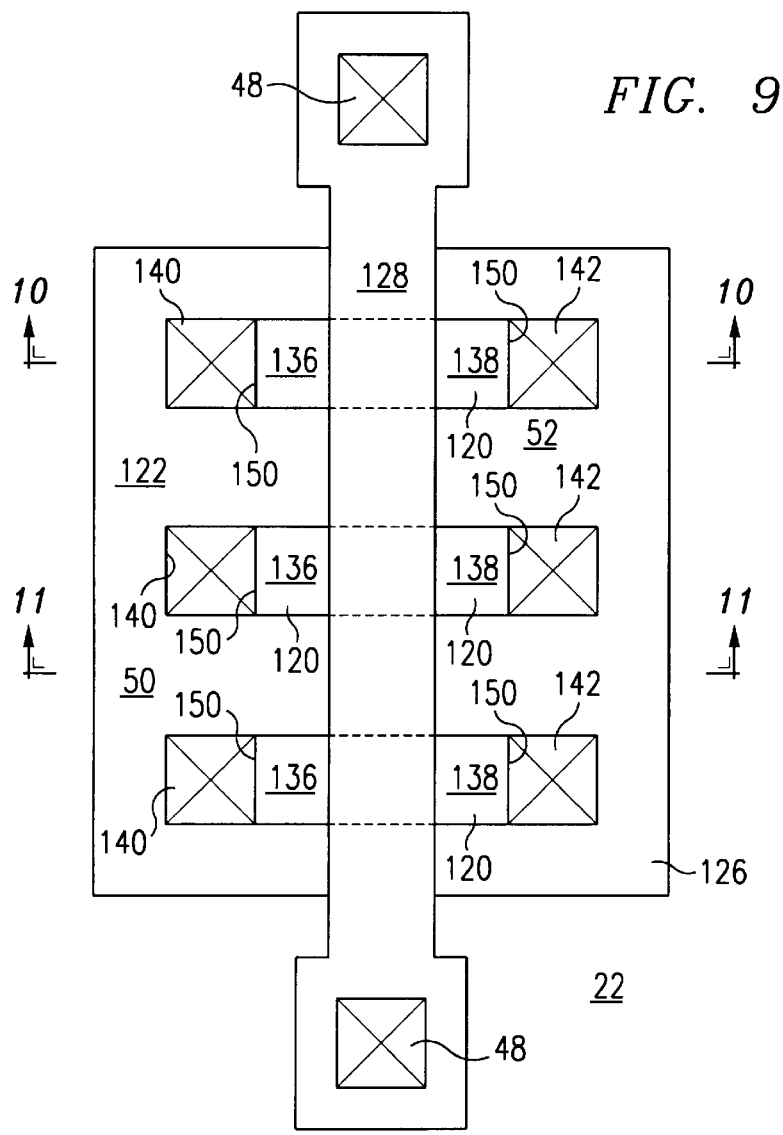
FIG. 9 is a plan view of the transistor shown in FIG. 8.

An alternative embodiment of the invention is shown in FIGS. 6 and 7. As in the first embodiment, the semiconductor layer 20 is silicon and is selected such that its surface is of 1-0-0 crystallography. The active device area 24 is patterned and etched as before, with truncated pyramidal trenches or valleys 100 appearing in the place of vertical trenches 26. The frusto-pyramidal trenches 100 will have sloping sidewalls 102 that form an angle of 54.7° with respect to the horizontal, and may be rounded as shown in FIG. 7. The gate insulator layer 36, and the subsequently formed, downwardly extending fingers 56 of the poly gate 46, will provide more effective step coverage on the sloped sidewalls 102 than with vertical sidewalls, with fewer processing problems and higher yield. On the other hand, the resultant device will occupy more real estate for the same effective conducting width w. The timing of the etch used in forming the sloped trenches 100 should be carefully controlled such that a relatively flat bottom surface 104 is formed; if the etch continues on too long, sloping sides 102 will meet at the middle. The remaining steps of the process forming the device shown in FIGS. 6 and 7 are the same as previously described; for example, the source and drain implants forming source 50 and drain 52 are self-aligned to the gate 46, as before.

FIGS. 8–11 illustrate a further embodiment of the invention. Instead of a plurality of trenches 26 (FIGS. 1–5) a plurality of upstanding bars, eminences or mesas 120 protrude from a general surface 122 of a semiconductor workpiece 124. In this embodiment, after the formation of LOCOS oxide regions 22, the surface of the active device area 126 is patterned and etched so as to leave a plurality of spaced-apart bars 120. After the creation of the bars 120, implants of suitable dopants to affect the $V_t$ and punch-through characteristics of the channel regions to be formed are performed within the active device area 126, using angled implants as before. The dopants are chosen to match the conductivity type of the substrate. A gate insulator layer 127 (FIG. 10) is grown on all exposed surfaces of the semiconductor surface 122 and bars 120.

Next, a layer of poly is deposited, rendered highly conductive, patterned and etched so as to create a continuous elongated poly gate 128 which extends at an angle across the bars 120 and preferably in a direction perpendicular to the orientation of the bars 120. The deposition is performed to a depth sufficient to occupy each of the regions 130 in between the bars 120 but also so as to be conductively continuous. After deposition but prior to patterning and etching, the gate 128 may be planarized by, for example, chemical/mechanical polishing (CMP) to present a relatively flat surface as shown. As patterned and etched, the gate 128 will include a plurality of downwardly extending fingers 132. Its width should be substantially less than the length of the bars 120 so as to permit source/drain region formation on the bar ends, as will be discussed below.

Figure 10:
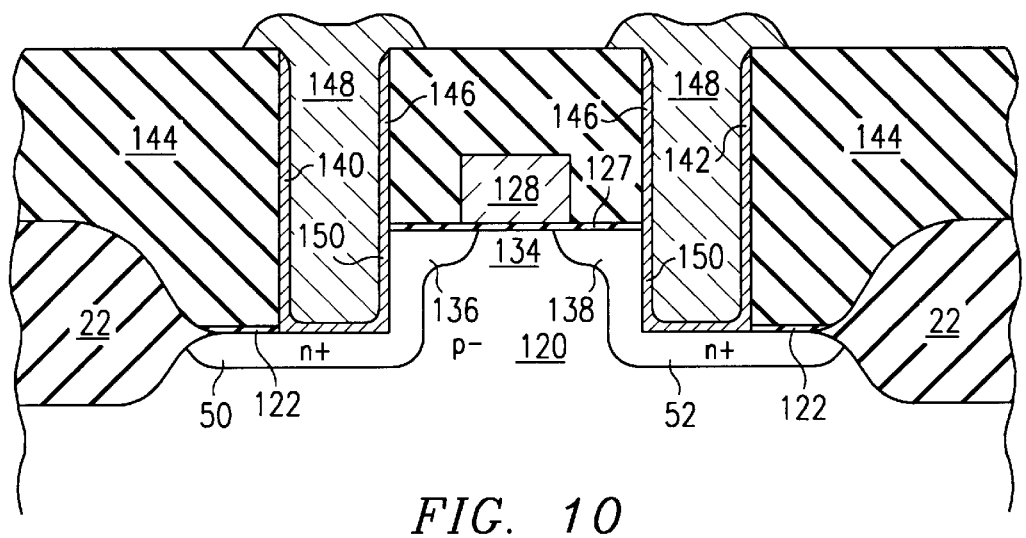
FIG. 10 is a schematic cross-sectional view taken substantially along line 10—10 of FIG. 9.
Figure 11:
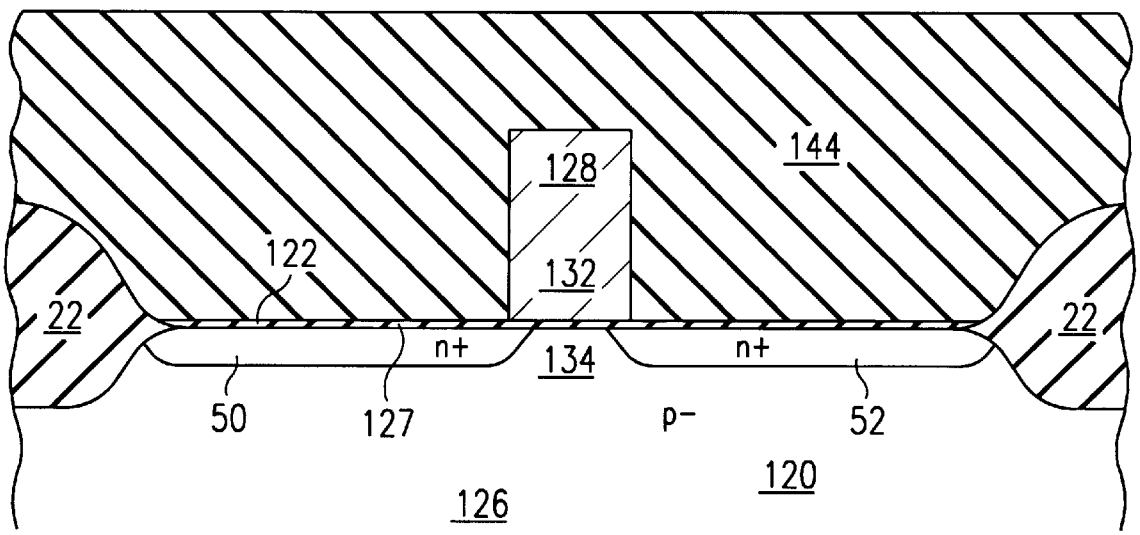
FIG. 11 is a schematic cross-sectional view taken substantially along line 11—11 of FIG. 9.

After formation of poly gate 128, a self-aligned source/drain implant is performed, as before; advantageously, the source/drain implant should occur at various angles to the surface 122. This creates a continuous source region 50 and a continuous drain region 52, as separated by a channel region 134 (FIG. 10). The source region 50 will include ends 136 of each of the bars 120. The drain region 52 will include ends 138 of each of the bars 120 which are disposed in opposition to the ends 136.

As before, the gate 128 is extended up and out of the active device area 126 onto the LOCOS regions 22 at one or both ends of the structure. These extensions are used to make contacts 48 to the gate 128.

After implantation of the source and drain regions 50 and 52, the active device area 126 is back-filled with an appropriate insulator 144 such as oxide and a plurality of source contact holes 140 and drain contact holes 142 are patterned and etched into the insulator layer 144. In the isometric view shown in FIG. 8, the contact holes 140 and 142 are rendered to be transparent so as to reveal detail behind them; further, while the contact holes 142 are shown to be cubical or rectangular, in actuality there will be rounding of their corners. The contact holes 140 and 142 may be lined with a layer 146 of a metal, such as Ta, TaN, Ti, Ti/TiN, TiW alloy or other similar adhesion and/or diffusion barrier metalization, which provides ohmic contact to the source and drain regions 50 and 52 and may prevent metal ions from diffusing into the adjacent semiconductor material. Thereafter, the contact holes may be filled with tungsten, copper or aluminum, and thereafter metal conductors, which may be formed of aluminum or copper, are deposited, patterned and etched to complete the device.

Figure 12:
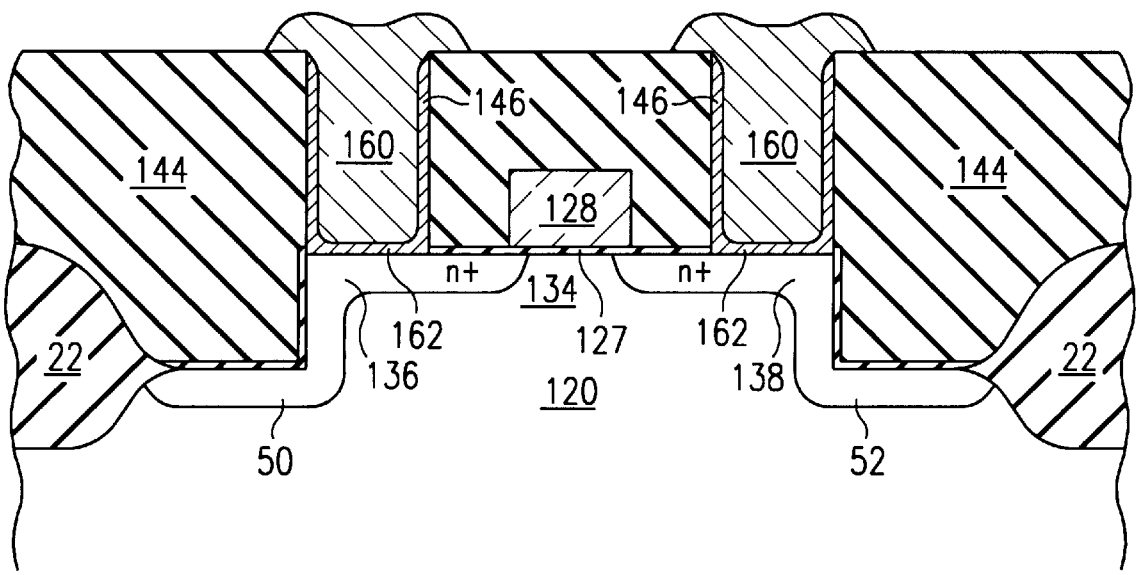
FIG. 12 is a schematic cross-sectional view corresponding to the view shown in FIG. 10 but showing another embodiment of the invention.

A technical advantage of this embodiment is the adjacency of each contact 148 to both the surface 122, which forms a floor or bottom surface of each of the contact holes 140 and 142, and an end or sidewall 150 of each semiconductor bar 120. This provides conductive contact to the corresponding source or drain region on both a bottom and a side of the contact, thereby increasing current-carrying capacity. In an alternative embodiment (FIG. 12), contacts 160 may instead be made to the top surface 162 of the source/drain ends 136 and 138, which would be laterally extended for this purpose to provide sufficient clearance from the gate 46.

In summary, a novel bar field effect transistor device has been shown and described, in which a plurality of bars or trenches are used in order to increase the effective area of close adjacency of the field effect transistor's control gate. The reticulated nature of the resultant channel region permits a greater effective current-carrying cross-section, and therefore an increased current-carrying capacity for the actual width w of the transistor.

While illustrated embodiments of the invention and their technical advantages have been shown and described in the above detailed description and in the drawings, the present invention is not limited thereto but only by the scope and spirit of the appended claims.

We claim:

1. A method of fabricating field-effect transistors, comprising the steps of:

providing a semiconductor layer having a first conductivity type:

forming a plurality of raised bars to extend above general surface of the semiconductor layer, each of the bars being elongated in a first direction and spaced apart by respective valleys in a second direction different from the first direction;

forming gate insulators on top surfaces of each said bars, and on bottoms of the valleys and on sidewalls of the bars which extend between the top surfaces and the valleys;

forming a conductive layer on each gate insulator layer so as to be disposed adjacent the top surfaces of the bars, and the bottoms of the valleys and the side walls;

patterning and etching the conductive layers to define an elongated continuous conductive gate which extends across the bars and into the valleys in the second direction, said gate being common to said field-effect transistors; and implanting source regions and drain regions into portions of the semiconductor layer, each source and drain region being laterally adjacent to one another, with a channel region therebetween and adjacent to the bars, the side walls and bottoms of the valleys so as to be self-aligned to the conductive gate, a dopant selected for said step of implanting such that the source region and drain region are of second conductivity type opposite the first conductivity type.

2. The method of claim 1, wherein the elongated conductive gate is patterned and etched to have a width substantially less than a length of said bars.

3. The method of claim 1, and further comprising the steps of:

implanting the source region and the drain region to extend in the first direction beyond ends of the bars;

forming a contact hole at the end of at least one bar within the source region;

forming a contact hole at the end of at least one bar within the drain region; and contacting each of the source region and the drain region at the ends of the bars such that contact will be made to the source region and the drain region through both sidewalls and bottoms of the respective contact holes.

4. The method of claim 1, and further comprising the steps of:

contacting the source region on the top surface of at least one bar so as to be spaced from the conductive gate; and contacting the drain region on the top surface of at least one bar so as to be spaced from the conductive gate.

5. The method of claim 1, wherein said step of implanting further comprises the steps of:

implanting the dopant at a first angle to the sidewalls to introduce dopant into regions of the semiconductor layer adjacent first ones of the sidewalls; and implanting the dopant at a second angle to the sidewalls different from the first angle to introduce dopant into regions of the semiconductor layer adjacent second ones of the sidewalls.

6. The method of claim 5, and further comprising the step of implanting the dopant at an angle perpendicular to the general surface of the semiconductor layer.

7. The method of claim 1, and further comprising the steps of:

prior to said step of depositing the conductive layer, implanting dopant at a first angle to the sidewalls to introduce dopant into regions of the semiconductor layer adjacent first ones of the sidewalls; and prior to said step of depositing the conductive layer, implanting dopant at a second angle to the sidewalls to introduce dopant into regions of the semiconductor layer adjacent second ones of the sidewalls.

8. The method of claim 7, and further comprising the step of prior to said step of depositing the conductive layer, implanting dopant at an angle perpendicular to the general surface of the semiconductor layer.

9. The method of claim 7, wherein a channel region spaces apart the drain region from the source region, the dopant implanted prior to said step of depositing the conductive layer being selected from dopant for prevention of channel region punch-through and dopant for adjusting the threshold voltage of the channel region.

10. A method of fabricating field effect transistors at a general surface of a semiconductor layer having a first conductivity type, comprising the steps of:

patterning and etching a plurality of trenches to extend downwardly from the surface of the semiconductor layer, the trenches being spaced apart from each other in a first direction, the trenches having bottom surfaces and defining therebetween a plurality of ridges with top surfaces of the ridges;

forming a gate insulator layer on the bottom surfaces of each of the trenches, the top surfaces of the ridges and the sidewalls;

forming conductive layers adjacent each of the gate insulators so as to be disposed insulatively adjacent the top surfaces of the ridges, the bottoms of the trenches and the side walls;

patterning and etching the conductive layers to form an elongated continuous conductive gate, that extend into the trenches and across the ridges in the first direction, said continuous gate being common to said field-effect transistors; and implanting source regions and drain regions into portions of the semiconductor layer, each source region and drain region being laterally adjacent one another with a channel region therebetween and adjacent the bottom surfaces of the trenches the ridges and the sidewalls so as to be self-aligned to the conductive gate, a dopant for said step of implanting selected such that the source region and the drain region are of a second conductivity type opposite the first conductivity type.

11. The method of claim 10, and further comprising the step of patterning and etching the conductive gate so as to have a width that is less than the length of any of the trenches.

12. The method of claim 10, wherein said step of implanting further comprises the steps of:

implanting the dopant at a first angle to the sidewalls to introduce dopant into regions of the semiconductor layer adjacent first ones of the sidewalls; and implanting the dopant at a second angle to the sidewalls to introduce dopant into regions of the semiconductor layer adjacent second ones of the sidewalls.

13. The method of claim 12, and further comprising the step of implanting the dopant at an angle perpendicular to the general surface of the semiconductor layer.

14. The method of claim 10, and further comprising the steps of:

prior to said step of forming the conductive layer, implanting dopant at a first angle to the sidewalls to introduce dopant into regions of the semiconductor layer adjacent first ones of the sidewalls; and prior to said step of forming the conductive layer, implanting dopant at a second angle to the sidewalls to introduce dopant into regions of the semiconductor layer adjacent second ones of the sidewalls.

15. The method of claim 14, and further comprising the step of prior to said step of depositing the conductive layer, implanting dopant at an angle perpendicular to the general surface of the semiconductor layer.

16. The method of claim 14, wherein a channel region spaces apart the drain region from the source region, the dopant implanted prior to said step of depositing the conductive layer being selected from dopant for prevention of channel region punch-through and dopant for adjusting the threshold voltage of the channel region.

* * * * *

UNITED STATES PATENT AND TRADEMARK OFFICE
CERTIFICATE OF CORRECTION

PATENT NO. : 6,180,441 B1  Page 1 of 1
DATED : January 30, 2001
INVENTOR(S) : Yue et al.

It is certified that error appears in the above-identified patent and that said Letters Patent is hereby corrected as shown below:

Claim 1,
Line 51, after "each" insert -- of --;
Line 63, delete "portions";
Line 64, delete "of".

Signed and Sealed this

Fifth Day of March, 2002

Attest:

JAMES E. ROGAN
Attesting Officer  Director of the United States Patent and Trademark Office